United States Patent
Schmidt et al.

(10) Patent No.: US 7,573,283 B2
(45) Date of Patent: Aug. 11, 2009

(54) METHOD FOR MEASUREMENT OF A DEVICE UNDER TEST

(75) Inventors: Axel Schmidt, Stolpchen (DE); Frank Fehrmann, Priestewitz (DE); Ulf Hackius, Dresden (DE); Stojan Kanev, Sacka (DE); Steffen Laube, Senftenberg (DE); Jorg Kiesewetter, Thiendorf (DE)

(73) Assignee: SUSS Micro Tec Test Systems GmbH, Sacka (DE)

( * ) Notice: Subject to any disclaimer, the term of this patent is extended or adjusted under 35 U.S.C. 154(b) by 11 days.

(21) Appl. No.: 11/765,019

(22) Filed: Jun. 19, 2007

(65) Prior Publication Data
US 2008/0315903 A1    Dec. 25, 2008

(51) Int. Cl.
*G01R 31/06* (2006.01)
(52) U.S. Cl. .................. 324/765; 324/754; 324/758
(58) Field of Classification Search .................. None
See application file for complete search history.

(56) References Cited

U.S. PATENT DOCUMENTS

| 5,410,259 A * | 4/1995 | Fujihara et al. ............ 324/758 |
| 5,436,571 A * | 7/1995 | Karasawa .................. 324/765 |
| 5,773,987 A * | 6/1998 | Montoya .................... 324/765 |
| 6,198,299 B1 * | 3/2001 | Hollman ..................... 324/758 |
| 6,707,310 B2 * | 3/2004 | Takekoshi ................. 324/758 |

* cited by examiner

*Primary Examiner*—Vinh P Nguyen
(74) *Attorney, Agent, or Firm*—Heslin Rothenberg Farley & Mesiti P.C.

(57) ABSTRACT

A method is disclosed for measurement of wafers and other semiconductor components in a probe station, which serves for examination and testing of electronic components. The device under test is held by a chuck and at least one electric probe by a probe support and the device under test and the probe are selectively positioned relative to each other by a positioning device with electric drives and the device under test is contacted. The drive of the positioning device remains in a state of readiness until establishment of contact and is switched off after establishment of contact and before measurement of the device under test.

15 Claims, 3 Drawing Sheets

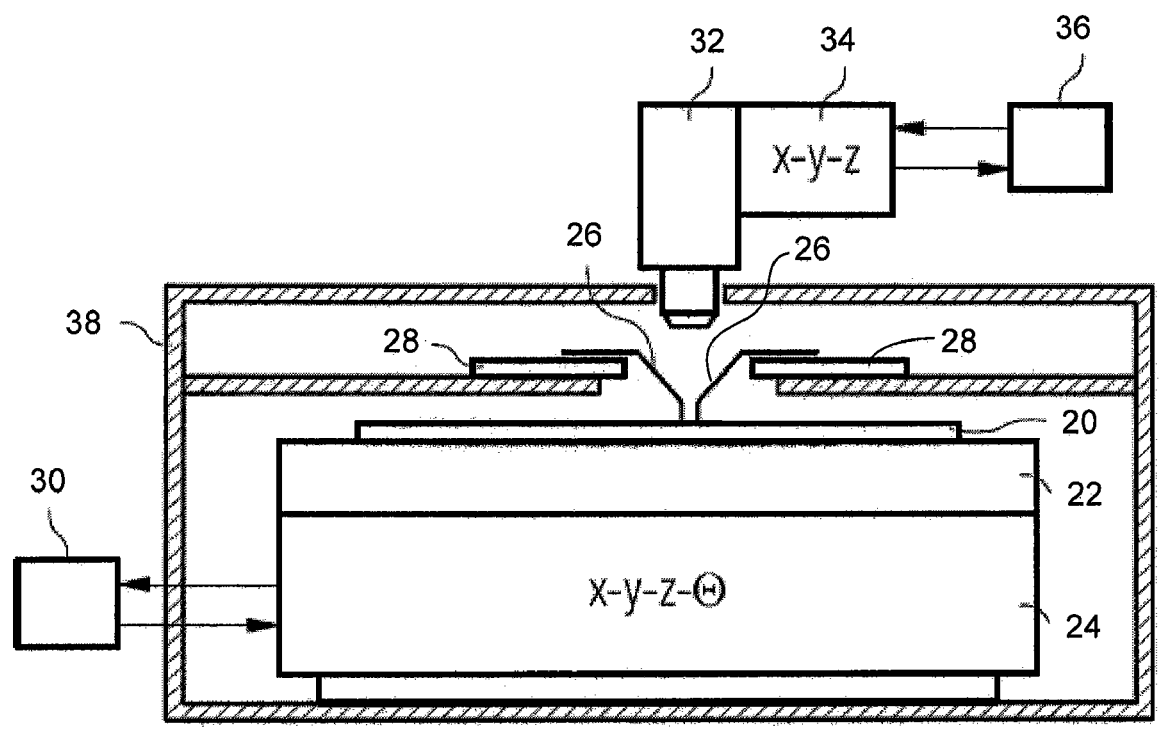
FIG. 1
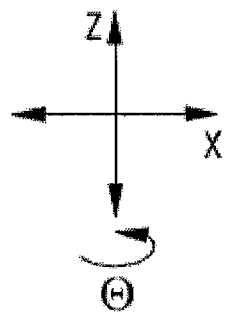

METHOD FOR MEASUREMENT OF A DEVICE UNDER TEST

BACKGROUND OF THE INVENTION

A method is disclosed for measurement of wafers and other semiconductor components in a probe station which is used for examination and testing of electronic components.

Any electronic, micromechanical or optical components formed in a semiconductor substrate is understood subsequently to mean a semiconductor component. Such a semiconductor component or wafer that includes a series of such components is referred to as device under test in conjunction with a measurement.

In a probe station a device under test is subjected to different measurements for examination purposes or for tests or to determine its parameters, in which a measurement can also be carried out under special environmental conditions. The device under test is contacted with a probe for the measurement in order to supply or take off a measurement signal. For this purpose a contact surface of the device under test and the probe must be positioned relative to each other and brought in contact, in which case several contact surfaces are often simultaneously contacted by several probes. One process step that influences the course of a measurement is movement of the device under test or the probe or both components to establish their contact.

Positioning of the device under test and contacting occur by means of electric drives. In order to minimize a possible influencing of the measurement by electromagnetic field of the electric drives, after each movement step, regardless of whether contact has already been established, the electric drives of the positioning device of the probe station are switched off, i.e., placed in a "quiet mode." Time is required before and after each movement for engagement and disengagement of the electric drives.

SUMMARY OF THE INVENTION

The method shortens the time required for establishment of contact and therefore the duration of a measurement in comparison with known methods. This time shortening of the movement process occurs by definition of the time for the quiet mode from technical parameters, namely the conclusion of a movement in the direction toward the device under test up to achievement of contact with the probe. Consequently, in addition to a different type of manual effect, movement processes deviating from this can be ruled out for activation of the quiet mode and technical parameters can now be used for automation purposes.

Switching off of each drive of the positioning device during measurement minimizes influencing of the measurement by electromagnetic fields of the drives so that measurements with low current and voltage signals, so-called low current measurements, can be executed even without costly shielding between the drive and the device under test.

BRIEF DESCRIPTION OF THE DRAWINGS

FIG. 1 schematically illustrates one embodiment of a system for measurement of a device under test.

DETAILED DESCRIPTION OF THE INVENTION

Figure 2:
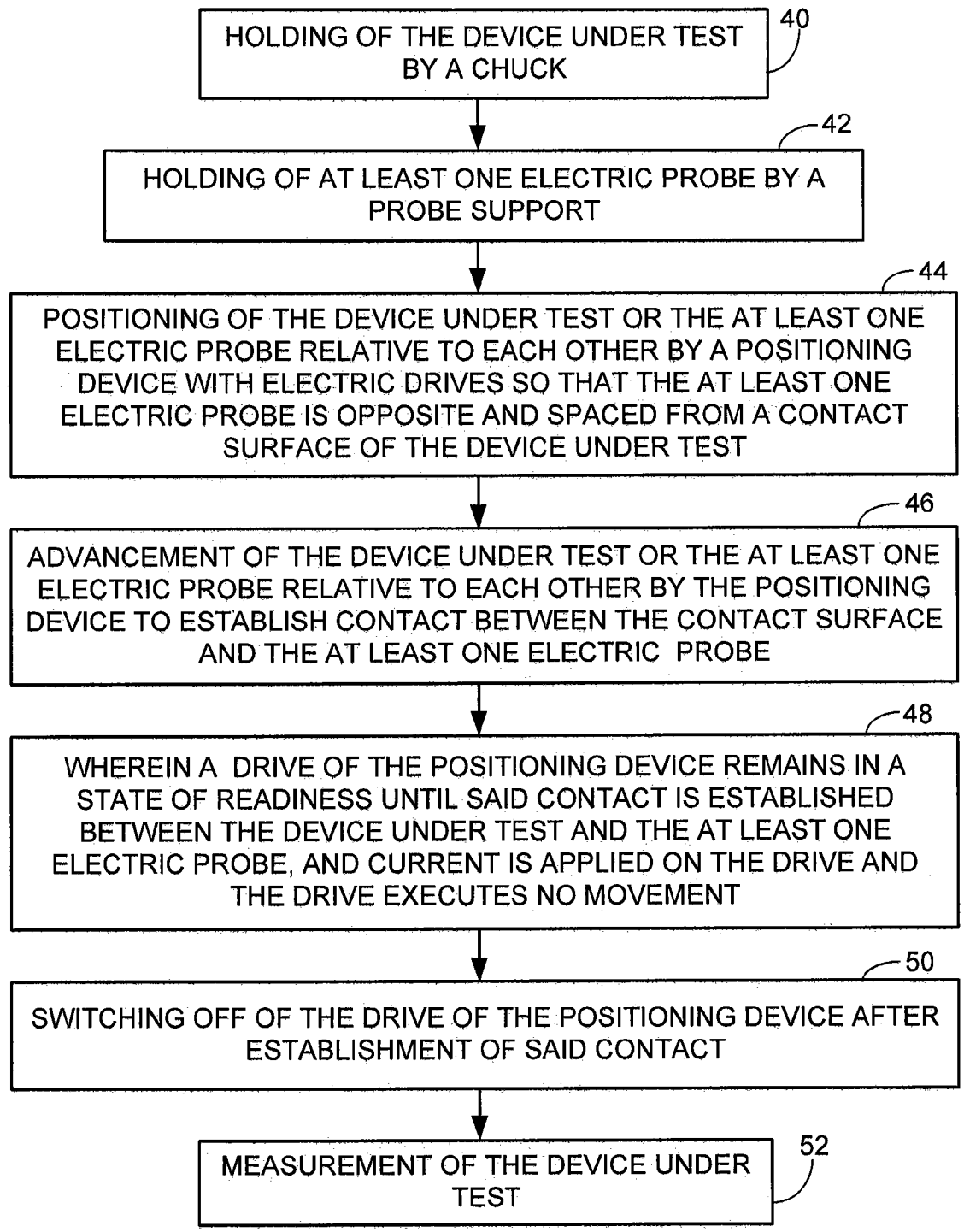
FIG. 2 illustrates one embodiment of a method for measurement of a device under test.

In one embodiment of the invention, as schematically illustrated in FIG. 1, a device under test 20 is placed on the support surface of the chuck 22 and secured by the chuck 22. The chuck 22 has an X-Y-Z-Θ-Table 24 for movement of the chuck 22 and therefore the device under test 20. This table 24 permits movement in both directions of an X-Y plane, which is defined as a plane line parallel to the support surface of the chuck 22. It also permits movement in a Z direction perpendicular to the X-Y plane and rotation with an angle theta (Θ) around a Z axis lying in the Z direction. The angle alignment of the chuck 22 occurs by means of a theta-drive on the table 24 in order to adjust a defined angle Θ of a reference line or reference edge of the device under test 20 relative to the X or Y direction. Performance of the individual movements in the X-Y plane or the Z direction and angle alignment occur with a separate drive, individual ones or all of which can be electrically operated.

At least one probe 26 is arranged opposite the device under test 20, in which it is held by a probe support 28. Different probe supports 28 are known as probe support of one or more probes, depending, for example, on the device under test 20, the test signals to be supplied or taken off, or the movement processes required in the probe station during a measurement or between two measurements. For example, the probes 26 are mounted on a probe card with which alignment and fastening of the probes relative to each other occurs and for arrangement of the contact surfaces of the device under test 20 being simultaneously contacted, as well as establishment of an electrical connection from the probes to an interface for connection of a measurement instrument. Such probes cards generally do not include an intrinsic manipulator unit, they are appropriately aligned before measurement or measurement sequence relative to the chuck 22 and therefore the device under test 20 and remain in this position. The movements for positioning and contacting occur here during a measurement only through the chuck 22.

In another embodiment the probes, individually or combined into groups, are mounted on so-called probe heads. The probe heads also serve for alignment, fastening and electrical connection of the probe or probes 26 but also include a manipulator movement that serves to move the probe heads and is operated manually or by a motor. Whereas the combination of movements executable with a manual or motorized manipulator unit are comparable to the movements of a chuck 22, for measurement in the quiet mode only a motorized probe head is relevant so that the following explanations considering the manipulator unit always refer to one with a motorized probe head.

In different embodiments the manipulator unit can execute individual or all of the movements that are described above for the chuck 22, in which the implementable movements of the manipulator unit also occur by means of its own drive. These drives can be operated electrically in selective fashion or all of them can be operated.

The X-Y-Z-Θ-Table 24 of the chuck 22, as well as the manipulator unit of the probe supports 28, are components of the positioning device of the probe station and correspond to each other.

A positioning and contacting process will be described below as part of a measurement of a device under test 20, which is implemented by means of a positioning device with two electric drives for movement of the chuck 22 in the X-Y plane (X and Y drive) and with an electric drive to move the chuck 22 in the Z direction (Z drive). The description refers to positioning for establishing contact between a probe 26 and a contact surface of the device under test 20 for better overview, but occurs during simultaneous contacting of several contact surfaces by means of several probes 26 in the same manner, since the arrangement of the probes 26 on the probe support 28 relative to each other is such that it corresponds to the arrangement of the contact surfaces.

The probe 26 and the device under test 20 are secured relative to each other by the chuck 22 and probe support 28 so that the tip of the probe 26 in the Z direction always has a positive distance to the contact surface of the device under test 20, regardless of its position in the X-Y plane, which is overcome by the Z drive. At the beginning of the measurement all drives are ready but not active, i.e., current and voltage are applied, so that during a change in signal a movement occurs through the drive acted upon by the signal change. Control of the three drives occurs by means of a control unit 30, which is part of the positioning device. Starting from a start position, the device under test 20 and therefore its contact surface is moved in the X-Y plane by a means of these two drives of the chuck 22 into a measurement position in which the position of the contact surface in the X-Y plane coincides with the position of the probe 26 in this plane but with the pre-adjusted Z distance. Movement into the measurement position can consist of several partial steps or also include only one step in one direction. The latter applies, for example, if a grid of semiconductor components is to be traversed on a wafer and the grid is adjusted to the X and Y direction. Because of their readiness state the individual drives can be rapidly activated so that even for combined movement processes the time period required for positioning and contacting can be shortened in comparison with the prior art. After reaching the measurement position, the X and Y drive are again deactivated and placed in the readiness state.

Advance movement of a contact surface to the probe 26 in the Z direction then occurs by activation of the Z drive until the tip of the probe 26 touches the contact surface reliably (contact position). If before or during the advance movement an angle deviation is found between the required and actual advance movement, for example, because of a deviation from the achieved measurement position relative to the required one, the advance movement can be interrupted or reversed in order to make a correction in the measurement position in the X-Y plane. In this case only the drives in readiness state are activated, so that only a slight time loss develops from such a final correction.

Achievement of a contact position can be observed visually or by image processing by means of the optical device 32 or also by a control signal of the control unit 30 after the defined Z distance has been covered. For establishing reliable contact in one embodiment of the method at least achievement of the contact position can be visualized by an optical device 32. As an alternative or in addition, the advance movement occurs with the defined Z distance so that the contact position is achieved after overcoming the Z distance. With achievement of a contact position, deactivation of the Z drive occurs and at the same time termination of the state of readiness of all three drives, in which case the drives are switched off, i.e., switched into the "quiet mode."

After all drives are switched off, measurement of the device under test 20 occurs, while maintaining contact between the contact surface and the probe 26.

In one embodiment of the method, a signal is generated in the control unit 30 of the positioning device after achievement of the contact positioning, which establishes the quiet mode for all drives. Since establishment of the quiet mode is coupled to establishment of the contact position and is therefore a recordable parameter, it is decoupled from the actual performance of a measurement so that the probe station functions as a master and a measurement instrument connected to the probe station functions as slave.

If several contact surfaces of a device under test 20 are contacted by means of several probes 26, additional movement processes for contacting the device under test can be required so that in other embodiments of the method movements in the X-Y plane and in the Z direction occur by means of the manipulator unit of the probe supports. For example, a crude positioning of the chuck 22 can be supplemented with fine positioning of the probes 26. In this case adjustment of the measurement position occurs by appropriate combination of the movements of the chuck 22 and the probes 26 before the advance movement to establish the contact position. The drive or the drives of the manipulator unit are also made inactive after individual partial movements but are in the state of readiness as long as the contact position is still not established. Termination of the state of readiness by switching off this drive or these drives also occurs after achievement of the contact position and before performance of the measurement. In one embodiment of the method this is also initiated by a signal, which is generated in the control unit 30 of the positioning device with achievement of the contact position.

In another embodiment the advance movement can also consist of several partial steps that are executed either by the chuck 22 or the probe support 28 alone or by a combination of both. In this case as well the drives remain in the state of readiness and only the drive required for the actual partial step is activated. Only after the last partial step, with which the contact position is reached, does switching off of all drives occur.

In one embodiment the optical device 32 is also moved by means of a movement device 34 with an electric drive, for example, to search in several partial steps for a focal point or contact position. This drive is also switched into the quiet mode for measurement of the device under test 20 by switching it off and remains in the state of readiness, like the electric drives of the positioning device, until the contact position is achieved. Switching off of this drive can also occur by generation of a signal, which can be based on measurement of technical parameters. Generation of the signal can then occur by a separate control unit 36 of the movement device 34 of the optical device 32 or, with corresponding connection of the movement device 34 to the control unit 30 of the positioning device through this control unit, as described above.

If the optical device 32 is electrically driven, for example, if it is a camera, this is also switched off in another embodiment with achievement of the contact position. This is the case in those applications when influencing of the measurement by electromagnetic fields of the optical device 32 is expected, for example, because of a limited spacing to the device under test 20 in the absence of shielding. If it permits control of the optical device 32, this can also remain in a state of readiness up to adjustment of the quiet mode.

In another embodiment of the method at least one of the electric drives of the positioning unit 24 just described or the movement unit 34 is controlled by a speed-controlled motor, for example a dc motor, which is controlled by pulse modulation. In such a motor controlled by speed a high frequency permanent signal is present with a defined frequency in the state of readiness. For activation of the motor a change of the signal occurs. Such motors, because of their power and control parameters, as well as because of their reproducible movements, are appropriate for driving a probe station but the permanent signal is appropriate for influencing the measurement of the device under test 20. The depicted method permits utilization of these motors for sensitive and time-critical measurements, i.e., in which the time factor is an important factor because of a large number of measurements or because of the requirements on a measurement signal.

Which type of electric drive is used to execute the aforementioned individual movements to be carried out with the positioning device depends on different requirements, for example, the required accuracy, the distance to be covered, the speed or possible limitation of a position determination. The accuracy depends on the size of the contact surface of the device under test 20, the distance, on the other hand, depends on the type of device under test 20, since the contact density on a wafer can be greater than in individual semiconductor components. In addition to the drive controlled by its speed, stepping motors or other drives can also be used, which are suitable because of their parameters and the requirements of positioning. One or more such drives as described above can also be combined with mechanical pre-drives.

In one embodiment a probe station has a housing 38, which encloses the chuck with the device under test 20, the probe support 28, including the probe 26 and at least one of the described components of the positioning device 24, in which case operation or control of the positioning device 24 occurs during the measurement process from outside of the housing. The housing 38 can serve different purposes. Thus, measurement can occur under atmospheric and pressure or temperature conditions that deviate from the environmental conditions or the measurement can occur as a low current measurement.

FIG. 2 illustrates one embodiment of a method for measurement of a device under test. The device under test is held 40 by a chuck. At least one electric probe is held 42 by a probe support. The device under test or the at least one electric probe are positioned 44 relative to each other by a positioning device with electric drives so that the at least one electric probe is opposite and spaced from a contact surface of the device under test. The device under test or the at least one electric probe are advanced 46 relative to each other by the positioning device to establish contact between the contact surface and the at least one electric probe. A drive of the positioning device remains 48 in a state of readiness until said contact is established between the device under test and the at least one electric probe, and current is applied on the drive and the drive executes no movement. The drive of the positioning device is switched off 50 after establishment of said contact. The device under test is measured 52.

Figure 3:
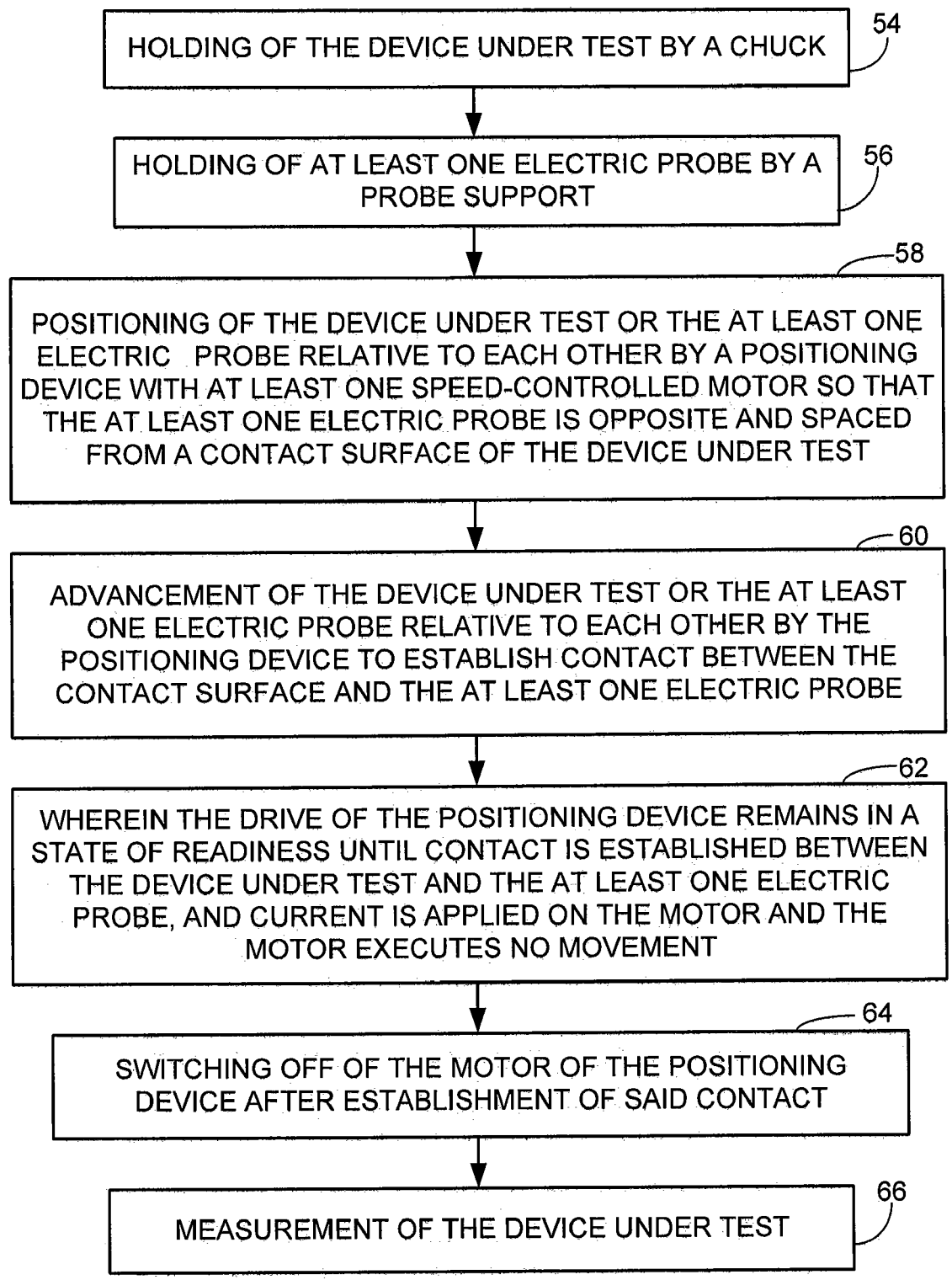
FIG. 3 illustrates another embodiment of a method for measurement of a device under test.

FIG. 3 illustrates another embodiment of a method for measurement of a device under test. The device under test is held 54 by a chuck. At least one electric probe is held 56 by a probe support. The device under test or the at least one electric probe are positioned 58 relative to each other by a positioning device with at least one speed-controlled motor so that the at least one electric probe is opposite and spaced from a contact surface of the device under test. The device under test or the at least one electric probe are advanced 60 relative to each other by the positioning device to establish contact between the contact surface and the at least one electric probe. The drive of the positioning device remains 62 in a state of readiness until contact is established between the device under test and the at least one electric probe, and current is applied on the motor and the motor executes no movement. The motor of the positioning device is switched off 64 after establishment of said contact. The device under test is measured 66.

The invention claimed is:

1. Method for measurement of a device under test comprising the steps of:
   a) holding of the device under test by a chuck,
   b) holding of at least one electric probe by a probe support,
   c) positioning of the device under test or the at least one electric probe relative to each other by a positioning device with electric drives so that the at least one electric probe is opposite and spaced from a contact surface of the device under test,
   d) advancing the device under test or the at least one electric probe relative to each other by the positioning device to establish contact between the contact surface and the at least one electric probe,
   e) wherein a drive of the positioning device remains in a state of readiness until said contact is established between the device under test and the at least one electric probe, and current is applied on the drive and the drive executes no movement,
   f) switching off of the drive of the positioning device after establishment of said contact, and
   g) measuring of the device under test.

2. Method for measurement of claim 1, wherein the drive of the positioning device includes more than one motor and each motor remains in the state of readiness until establishment of said contact and is switched off after establishment of said contact.

3. Method for measurement of claim 1, wherein at least one of the positioning or advancing occurs in several partial steps.

4. Method for measurement of claim 1, further comprising:
   a) observing at least one of said positioning and said advancement using an optical device in which the optical device is moved by a movement device comprising a movement device electric drive,
   b) wherein said movement device electric drive remains in a state of readiness until establishment of said contact and
   c) switching off of the movement device electric drive after establishment of said contact and before measurement of the device under test.

5. Method for measurement of claim 1, wherein the positioning device includes a control unit and a signal is generated in the control unit for switching off of the drive of the positioning device.

6. Method for measurement of claim 4, wherein the movement device further comprises a control unit and a signal is generated in the control unit to switch off the movement device electric drive.

7. Method for measurement of a device under test comprising the steps of:
   a) holding of the device under test by a chuck,
   b) holding of at least one electric probe by a probe support,
   c) positioning of the device under test or the at least one electric probe relative to each other by a positioning device with at least one speed-controlled motor so that the at least one electric probe is opposite and spaced from a contact surface of the device under test,
   d) advancing of the device under test or the at least one electric probe relative to each other by the positioning device to establish contact between the contact surface and the at least one electric probe,
   e) wherein the drive of the positioning device remains in a state of readiness until contact is established between the device under test and the at least one electric probe, and current is applied on the motor and the motor executes no movement,
   f) switching off of the motor of the positioning device after establishment of said contact, and
   g) measuring of the device under test.

8. Method for measurement of claim 7, further comprising:
a) observing at least one of the positioning or advancement by an optical device in which the optical device is moved by a movement device comprising a movement device electric drive,
b) wherein said movement device electric drive remains in a state of readiness until establishment of said contact between the device under test and probe, and
c) switching off of the movement device electric drive after establishment of said contact and before measurement of the device under test.

9. Method for measurement of claim 7, wherein the positioning device includes a control unit and a signal is generated in the control unit to switch off the motor of the positioning device.

10. Method for measurement of claim 8, wherein the movement device further comprises a control unit and a signal is generated in the control unit to switch off the movement device electric drive.

11. Method for measurement of claim 8, wherein the movement device electric drive comprises a speed-controlled motor.

12. Method for measurement of claim 4, wherein the optical device is operated electronically and is switched off after establishment of said contact and before measurement of the device under test.

13. Method for measurement of claim 1, wherein a housing encloses said positioning device, and at least one of said chuck and said probe support.

14. Method for measurement of claim 8, wherein the optical device is operated electronically and is switched off after establishment of said contact and before measurement of the device under test.

15. Method for measurement of claim 7, wherein a housing encloses said positioning device, and at least one of said chuck and said probe support.

* * * * *